(12) United States Patent
Mun et al.

(10) Patent No.: US 8,665,648 B2
(45) Date of Patent: Mar. 4, 2014

(54) FLASH MEMORY DEVICE HAVING SEED SELECTOR CIRCUIT

(75) Inventors: Kui-Yon Mun, Hwaseong-si (KR); Jongkeun Ahn, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 96 days.

(21) Appl. No.: 13/469,203

(22) Filed: May 11, 2012

(65) Prior Publication Data

US 2012/0287719 A1   Nov. 15, 2012

(30) Foreign Application Priority Data

May 11, 2011   (KR) .......................... 10-2011-0044133

(51) Int. Cl.
   *G11C 11/34*   (2006.01)
(52) U.S. Cl.
   USPC ............. 365/185.18; 365/185.17; 365/185.24
(58) Field of Classification Search
   USPC ............. 365/185.18, 185.12, 185.11, 185.17, 365/185.24, 185.25
   See application file for complete search history.

(56) References Cited

U.S. PATENT DOCUMENTS

| | | | |
|---|---|---|---|
| 2008/0239811 A1* | 10/2008 | Tanaka | 365/185.11 |
| 2010/0124120 A1* | 5/2010 | Park et al. | 365/185.19 |
| 2010/0259983 A1* | 10/2010 | Yoon | 365/185.12 |

\* cited by examiner

*Primary Examiner* — Alexander Sofocleous
*Assistant Examiner* — Hien Nguyen
(74) *Attorney, Agent, or Firm* — Volentine & Whitt, PLLC

(57) ABSTRACT

A flash memory device includes a memory cell array, a seed selector circuit, and a randomizing and de-randomizing circuit. The memory cell array includes memory cells forming multiple pages. The seed selector circuit stores seeds corresponding to the multiple pages, respectively. The randomizing and de-randomizing circuit randomizes data to be stored in a selected page. Each page has a corresponding seed and includes multiple sectors having corresponding sector offset values and seed values generated from the seed corresponding to the page. The seed selector circuit selects a seed value from the seed values of the selected page based on a sector offset value indicating a sector of the selected page to which a column offset value, input with an access request, belongs. The randomizing and de-randomizing circuit randomizes data to be stored in the selected page based on the seed value selected by the seed selector circuit.

20 Claims, 11 Drawing Sheets

| Page | Seed | | | |
|---|---|---|---|---|
| | SCT_Offset[0] | SCT_Offset[1] | SCT_Offset[2] | SCT_Offset[3] |
| P0 | 0x87f | RM[0x87f, 1K] | RM[0x87f, 2K] | RM[0x87f, 3K] |
| P1 | 0x45ef | RM[0x45ef, 1K] | RM[0x45ef, 2K] | RM[0x45ef, 3K] |
| P2 | 0x2309 | RM[0x2309, 1K] | RM[0x2309, 2K] | RM[0x2309, 3K] |
| P3 | 0x47af | RM[0x47af, 1K] | RM[0x47af, 2K] | RM[0x47af, 3K] |
| ⋮ | ⋮ | ⋮ | ⋮ | ⋮ |
| P127 | 0xef12 | RM[0xef12, 1K] | RM[0xef12, 2K] | RM[0xef12, 3K] |

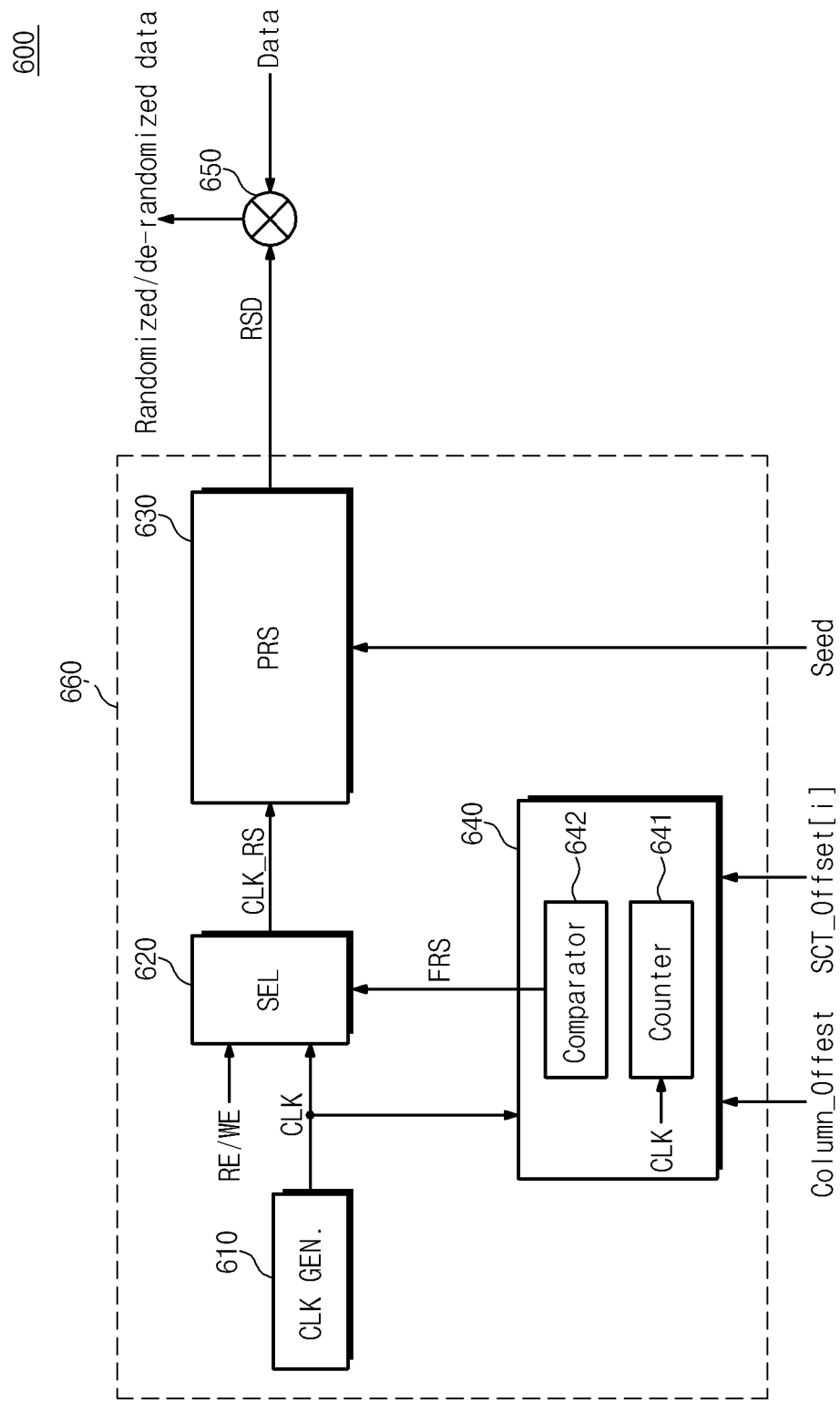

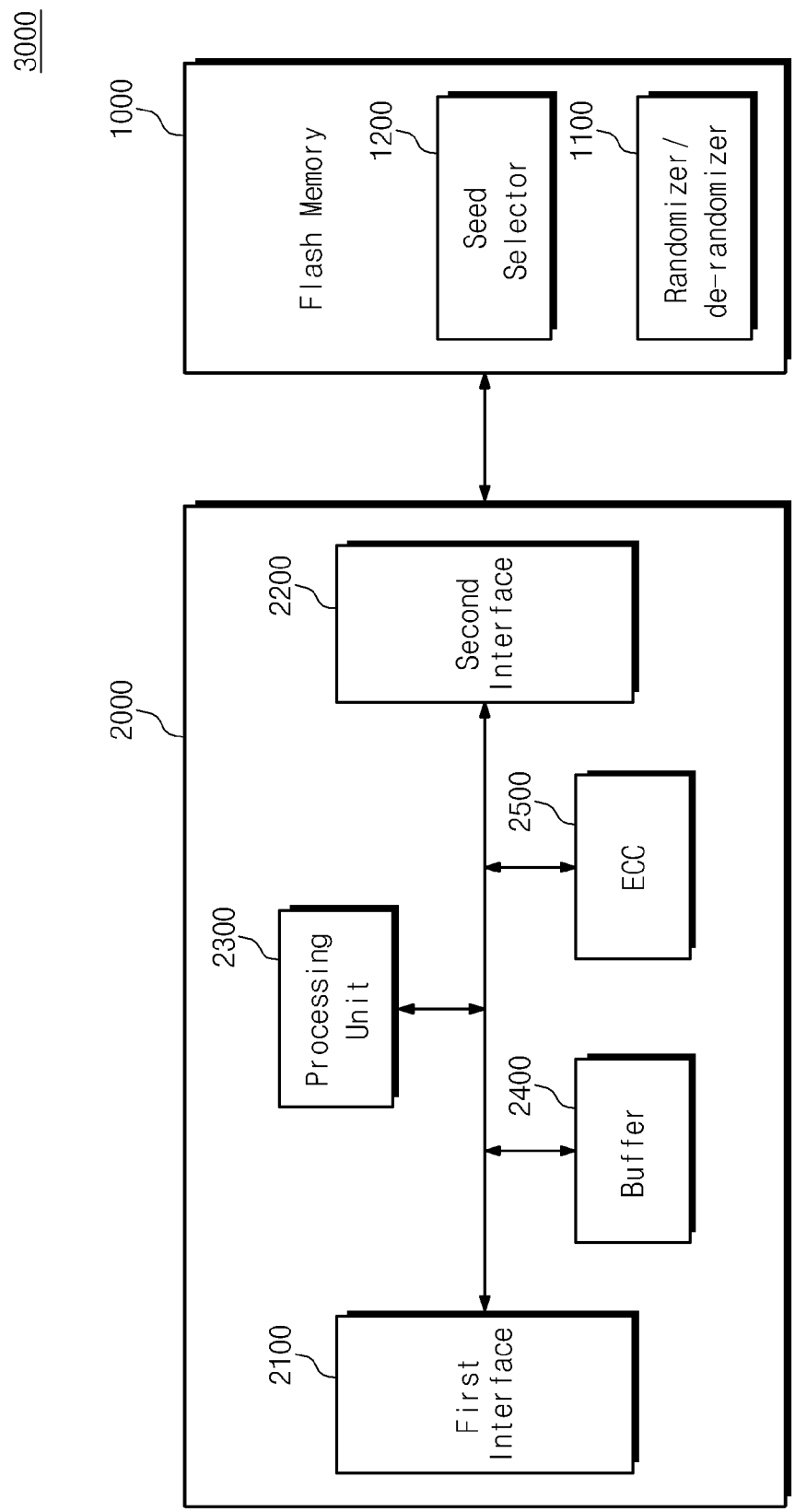

FLASH MEMORY DEVICE HAVING SEED SELECTOR CIRCUIT

CROSS-REFERENCE TO RELATED APPLICATIONS

A claim of priority under 35 U.S.C. §119 is made to Korean Patent Application No. 10-2011-0044133 filed May 11, 2011, in the Korean Intellectual Property Office, the entire contents of which are hereby incorporated by reference.

BACKGROUND

Exemplary embodiments relate to an electronic device, and more particularly, relate to a memory system.

One type of flash memory device is an EEPROM, in which multiple memory regions are erased or programmed by one program operation. A conventional EEPROM may enable only one memory region to be erased or programmed once. Such flash memory device operates more rapidly when systems using the flash memory device perform read and write operations on different memory regions simultaneously. All types of flash memory and EEPROM may wear out after a predetermined number of erase operations due to wearing-out or deterioration of insulation film surrounding a charge storing means used to store data.

A flash memory device may store information on a silicon chip such that power is not needed to retain information stored on the silicon chip. That is, the information is retained without power, e.g., when power to the silicon chip is turned off. Additionally, a flash memory device may provide resistance to physical impact and relatively fast read access times. Because of these characteristics, a flash memory device is generally used for data storage of battery-powered devices.

SUMMARY

One aspect of the inventive concept provides a flash memory device including a memory cell array, a seed selector circuit, and a randomizing and de-randomizing circuit. The memory cell array includes memory cells forming multiple pages. The seed selector circuit is configured to store seeds corresponding to the multiple pages, respectively. The randomizing and de-randomizing circuit is configured to randomize data to be stored in a selected page. Each page has a corresponding seed and includes multiple sectors having corresponding sector offset values and seed values generated from the seed corresponding to the page. The seed selector circuit selects a seed value from the seed values of the selected page based on a sector offset value indicating a sector of the selected page to which a column offset value, input with an access request, belongs. The randomizing and de-randomizing circuit randomizes data to be stored in the selected page based on the seed value selected by the seed selector circuit.

The flash memory device may further include a page buffer circuit between the memory cell array and the randomizing and de-randomizing circuit. The page buffer circuit is configured to store the randomized data in the memory cell array and to read data from the memory cell array.

The seed selector circuit of the flash memory device may include a seed table configured to store the seed values respectively corresponding to the sectors of each page, and an offset selector configured to determine whether the column offset value belongs to any one of sectors of the selected page and to output a sector offset value of a sector corresponding to the column offset value. The seed table may output a seed value of a sector corresponding to the sector offset value output by the offset selector.

The randomizing and de-randomizing circuit of the flash memory device may include a free-run detector, a selector, a pseudo-random sequence generator, and a mixer. The free-run detector is configured to generate a free-run signal in response to the column offset value and the sector offset value output by the offset selector. The selector is configured to select one of a clock signal and a read/write enable signal in response to the free-run signal, and to output a random sequence clock signal in response to the selected one of the clock signal and the read/write enable signal. The pseudo-random sequence generator is initialized with a seed value provided by the seed selector circuit and configured to generate a random sequence in response to the random sequence clock signal. The mixer is configured to randomize data to be stored in the memory cell array based on the random sequence.

The free-run detector may include a counter and a comparator. The counter is initialized with a sector offset value provided by the seed selector circuit and configured to operate in synchronization with the clock signal. The comparator is configured to compare the column offset value and a count value of the counter and to generate the free-run signal in response to the comparison.

The free-run signal may be activated when the column offset value is different from a count value of the counter, and the selector may select the clock signal as the random sequence clock signal in response to the activation of the free-run signal. The pseudo-random sequence generator may generate random sequence data in response to the clock signal as the random sequence clock signal, and the random sequence data generated according to the clock signal is not used for data randomization.

The free-run signal may be inactivated when the column offset value coincides with a count value of the counter, and the selector may select the read/write enable signal toggled by the access request as the random sequence clock signal in response to the inactivation of the free-run signal. The pseudo-random sequence generator may generate random sequence data in response to the read/write enable signal as the random sequence clock signal, and the mixer may logically combine the random sequence data and data input in synchronization with the read/write enable signal.

The offset selector may include comparators configured to receive the sector offset values, respectively, and the column offset value input with the access request, an encoder configured to encode outputs of the comparators, and a multiplexer configured to select one of the sector offset values in response to an encoding result of the encoder.

Another aspect of the inventive concept provides a flash memory device including a memory cell array, an offset selector, a seed table, a free-run detector, a selector, a pseudo-random sequence generator, and a mixer. The memory cell array includes memory cells forming a plurality of pages, each page including a plurality of sectors having corresponding sector offset values, respectively. The offset selector is configured to determine whether a column offset value input with an access request belongs to a sector of the plurality of sectors of a selected page, and to output a sector offset value of the sector corresponding to the column offset value as a result. The seed table is configured to store seeds corresponding to the plurality of pages, respectively, and to output a seed value of the sector corresponding to the sector offset value output by the offset selector, a seed corresponding to each page providing seed values corresponding to the plurality of sectors of the corresponding page, respectively. The free-run detector is configured to generate a free-run signal in response to the column offset value and a sector offset value output from the offset selector. The selector is configured to select one of a clock signal and a read/write enable signal in response to the free-run signal. The pseudo-random sequence generator is initialized with a seed value provided by the seed table and configured to generate a random sequence in response to the one of the clock signal and the read/write enable signal selected by the selector as a random sequence clock signal. The mixer is configured to randomize data to be stored in the memory cell array and the random sequence.

The flash memory device may further include a page buffer circuit configured to temporarily store data provided by the mixer or data to be provided to the mixer.

The free-run detector may include a counter initialized with a sector offset value provided by the seed selector and configured to operate in synchronization with a clock signal, and a comparator configured to generate the free-run signal in response to the column offset value input with the access request and a count value of the counter.

The free-run signal may be activated when the column offset value is different from the count value of the counter. The selector may select the clock signal as the random sequence clock signal in response to the activation of the free-run signal. The pseudo-random sequence generator may generate random sequence data in response to the clock signal as the random sequence clock signal, and random sequence data generated according to the clock signal may not used for data randomization.

The free-run signal may be inactivated when the column offset value coincides with the count value of the counter. Further, the selector may select the read/write enable signal toggled by the access request as the random sequence clock signal in response to the inactivation of the free-run signal. The pseudo-random sequence generator may generate random sequence data in response to the read/write enable signal as the random sequence clock signal. The mixer may logically combine random sequence data and data input in synchronization with the read/write enable signal.

The offset selector may include comparators configured to receive the sector offset values, respectively, and the column offset value input with the access request, an encoder configured to encode outputs of the comparators, and a multiplexer configured to select one of the sector offset values in response to an encoding result of the encoder.

Another aspect of the inventive concept provides a method of reading and writing randomized data in a memory cell array having multiple pages, each page including sectors having corresponding sector offset values. The method includes receiving an access request to access a selected page; identifying a seed value corresponding to the selected page in response to the access request; identifying a sector of the selected page to which a column offset value of the access request belongs, and a sector offset value of the identified sector; and determining whether the column offset value coincides with the sector offset value. When the column offset value does not coincide with the sector offset value, a free-run signal is activated for a free-run period and a clock signal is selected as a random sequence clock signal for generating random sequence data during the free-run period. When the column offset value coincides with the sector offset value or when the free-run period ends, the free-run signal is inactivated and a read/write enable signal toggled by the access request is selected as the random sequence clock signal for generating the random sequence data using the seed value, the random sequence data being logically combined with data input in synchronization with the read/write enable signal for one of randomizing or de-randomizing the data.

BRIEF DESCRIPTION OF THE FIGURES

Illustrative embodiments will be more clearly understood from the following detailed description taken in conjunction with the accompanying drawings, in which like reference numerals refer to like parts throughout the various figures unless otherwise specified.

FIG. 5 is a diagram illustrating an example of the seed table in FIG. 4, according to an exemplary embodiment of the inventive concept.

FIG. 7 is a block diagram illustrating an example of the randomizing and de-randomizing circuit in FIG. 1, according to an exemplary embodiment of the inventive concept.

FIG. 9 is a block diagram illustrating a memory system, according to an exemplary embodiment of the inventive concept.

DETAILED DESCRIPTION

Figure 1:
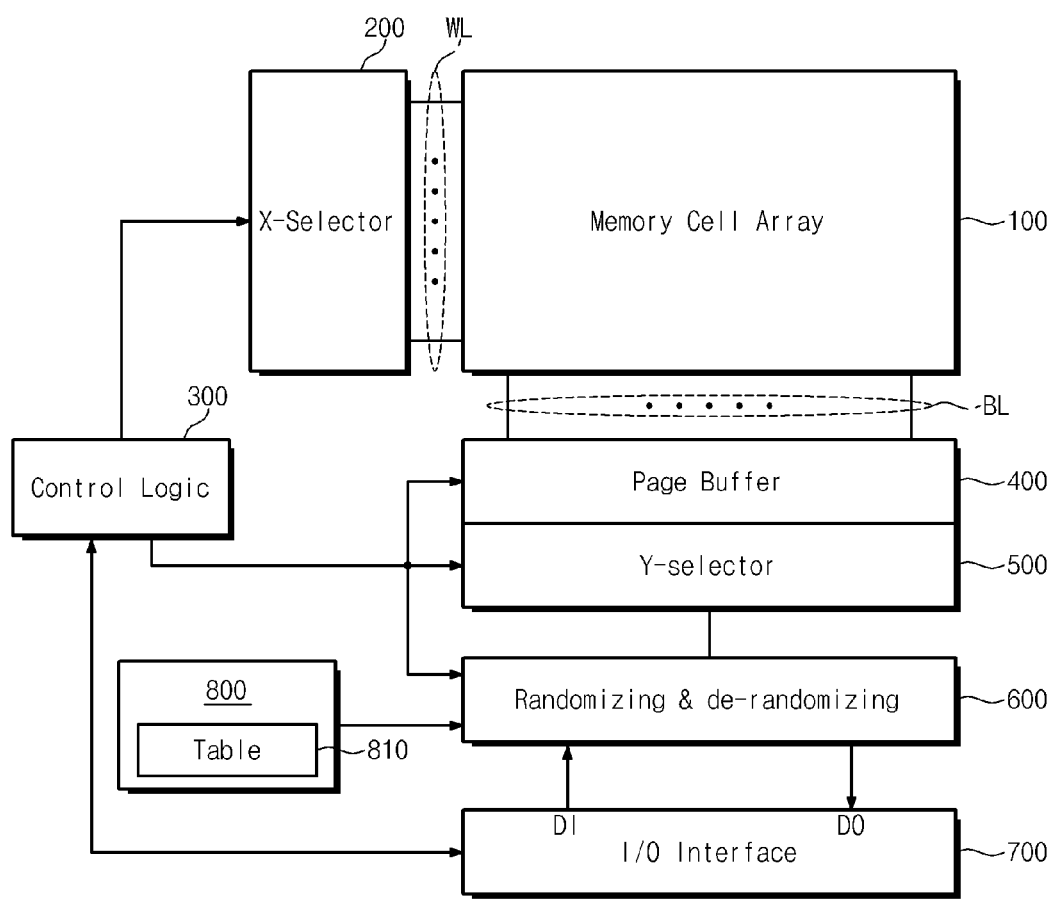
FIG. 1 is a block diagram showing a flash memory device, according to an exemplary embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram showing a flash memory device, according to an exemplary embodiment of the inventive concept. The flash memory device may be a NAND flash memory device, for example, although the inventive concept is not limited thereto. For example, the inventive concept may apply to various types of nonvolatile memory devices, such as phase change random access memory (PRAM), magnetoresistive random access memory (MRAM), a ferroelectric random access memory (FRAM), a resistance random access memory (RRAM), a spin transfer torque random access memory (STT-RAM), and the like.

Referring to FIG. 1, the flash memory device includes a memory cell array 100, which has memory cells arranged in rows (word lines: WL) and columns (bit lines: BL). Each memory cell may store 1-bit data or M-bit (multi-bit) data (M being an integer of two or more). When each memory cell stores 1-bit data, memory cells in each row of the memory cell array 100 may constitute a memory space. When each memory cell stores M-bit data, memory cells in each row of the memory cell array 100 may constitute memory spaces corresponding to multiple pages, respectively. Each memory cell may have a charge storing layer, such as a floating gate or a charge trap layer, or a variable resistance element, for example. The memory cell array 100 may have a single-layer array structure (referred to as a two-dimensional array structure) or a multi-layer array structure (referred to as a vertical-type or a stack-type three-dimensional array structure).

A row selector circuit 200 is controlled by control logic 300, and is configured to perform selection and driving operations on rows of the memory cell array 100. The control logic 300 may be configured to control overall operations of the flash memory device, as well. A page buffer circuit 400 is controlled by the control logic 300, and is configured to operate a sense amplifier or a write driver according to a mode of operation. For example, during a read operation, the page buffer circuit 400 may operate as a sense amplifier which senses data from a selected row of memory cells. During a program operation, the page buffer circuit 400 may operate as a write driver which drives a selected row of memory cells according to program data. The page buffer circuit 400 may include page buffers corresponding to bit lines or bit line pairs, respectively. When each memory cell stores multi-bit data, each page buffer of the page buffer circuit 400 may be configured to have two or more latches.

Continuing to refer to FIG. 1, a column selector circuit 500 is controlled by the control logic 300, and is configured to sequentially select columns (or page buffers) by predetermined unit during a read/program operation. A randomizing and de-randomizing circuit 600 randomizes data (that is, data to be programmed or original data), which are transferred via an input/output interface 700, under control of the control logic 300. The randomizing and de-randomizing circuit 600 also de-randomizes data (i.e., randomized data) of the page buffer circuit 400 transferred via the column selector circuit 500, under control of the control logic 300. According to exemplary embodiments, the randomizing and de-randomizing circuit 600 may be configured to perform randomizing and de-randomizing operations with respect to not only full-page data, but also random data less than the full-page data, such as data of a spare region, sector data, data more than sector data and less than page data, data less than sector data, etc., for example. This will be more fully described below. The randomization and de-randomization may be performed according to random or pseudo-random sequencing.

Data randomizing and de-randomizing may be performed based on random sequence data sequentially generated using a seed value. The seed value used to generate the random sequence data sequentially is provided by a seed selector circuit 800. In the depicted embodiment, the seed selector circuit 800 includes seed table 810, which stores seed values assigned to pages in each memory block, respectively. For example, the seed table 810 may include seed values corresponding to predetermined access points (or, predetermined sector offset values) of each page. When random access is requested, one of the seed values stored in the seed table 810 is provided to the randomizing and de-randomizing circuit 600. Two or more seed values associated with each page may be stored in the seed table 810. This will be more fully described below.

A memory cell may have any one of $2^N$ threshold voltage distributions (N indicating the number of data bits stored in a memory cell) according to the amount of charges stored in its charge storing means. A threshold voltage (or, a threshold voltage distribution) of a memory cell may be changed due to coupling (i.e., word line coupling) caused between adjacent memory cells. With the data randomizing of the inventive concept, it is possible to reduce the variation of threshold voltages of memory cells due to word line coupling. In other words, since states of memory cells are distributed uniformly, the degree of the word line coupling among memory cells may be relatively less than before data randomization. That is, the variation of threshold voltages of memory cells may be suppressed. Accordingly, the read margin and thus reliability are improved.

In various embodiments, the randomizing and de-randomizing operations are performed selectively. When access to specific data or a specific region is requested, the randomizing and de-randomizing circuit 600 may perform various randomizing and de-randomizing operations. For example, the randomizing and de-randomizing circuit 600 may transfer data input via the input/output interface 700 to the page buffer circuit 400 without execution of a randomizing operation. Afterwards, the randomizing and de-randomizing circuit 600 may perform randomizing on data loaded onto the page buffer circuit 400 under the control of the control logic 300.

Figure 2:
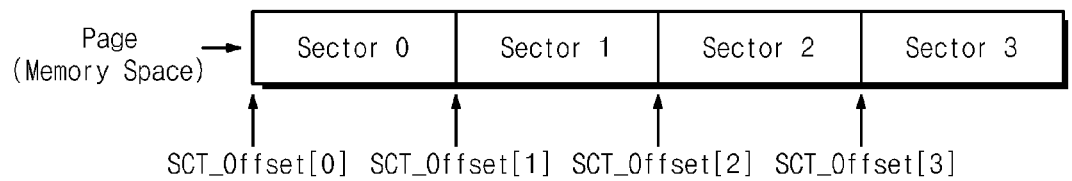
FIG. 2 is a block diagram for describing a memory space of a flash memory device, according to an exemplary embodiment of the inventive concept.

FIG. 2 is a block diagram for describing a memory space of a flash memory device, according to an exemplary embodiment of the inventive concept.

Multiple memory spaces may be provided to the illustrative flash memory device depicted in FIG. 1. For ease of description, one memory space is exemplarily shown in FIG. 2. The memory space may correspond to one page, for example. As shown in FIG. 2, the memory space or page includes multiple sectors, depicted as Sector 0 to Sector 3, for example. The sectors may be the same size (e.g., 512 Bytes, 1K bytes, 2K bytes, 4K bytes, etc.). The sectors Sector 0 to Sector 3 having corresponding sector offset values SCT_Offset[0] to SCT_Offset[3] indicating respective boundaries of the sectors. Data to be stored in the memory space may be randomized depending upon the seed value assigned to the memory space. In various embodiments, seed values corresponding to respective sectors in the memory space are stored in the seed table 810 in FIG. 1. For example, seed values corresponding to the sector offset values SCT_Offset[0] to SCT_Offset[3] for selecting respective Sector 0 to Sector 3 may be stored in the seed table 810 by page. The seed values corresponding to the sector offset values SCT_Offset[1] to SCT_Offset[3] may depend on the seed value corresponding to the sector offset value SCT_Offset[0], for example, which may be the seed value assigned to the memory space. Thus, the seed values corresponding to the respective sector offset values are assigned to one memory space (e.g., one page).

Figure 3:
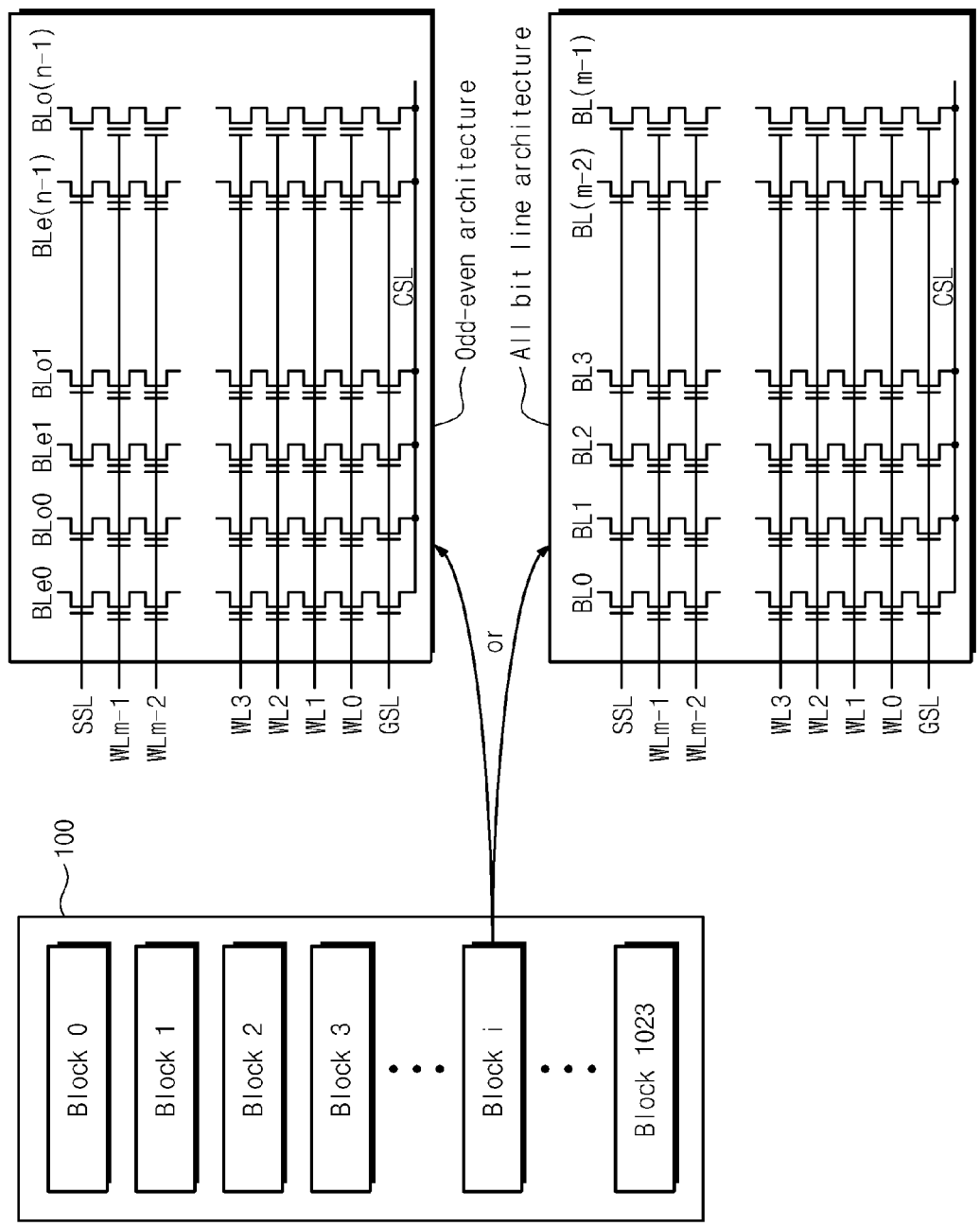
FIG. 3 is a circuit diagram showing an example of the memory cell array illustrated in FIG. 1, according to exemplary embodiments of the inventive concept.

FIG. 3 is a circuit diagram showing an example of the memory cell array illustrated in FIG. 1, according to exemplary embodiments of the inventive concept. More particularly, FIG. 3 shows that the memory cell array illustrated in FIG. 1 may be formed of memory blocks having all bit line architecture or odd-even architecture. Exemplary structures of the memory cell array 100 will be described.

As an example, a NAND flash memory device may include a memory cell array 100 partitioned into 1,024 blocks. The data stored in each block may be simultaneously erased or may be erased by memory sub-block units. In an embodiment, the memory block or the memory sub-block is the minimum unit of storage elements that are simultaneously erased. Each memory block, for example, has columns respectively corresponding to bit lines (e.g., bit lines of 1 KB). According to an embodiment having an all bit line (ABL) architecture, all the bit lines of a memory block are capable of being simultaneously selected during read and program operations. Storage elements in a word line selected by a row selector circuit 200 and connected to all bit lines are capable of being programmed at the same time.

In an embodiment, multiple storage elements in the same column may be connected in series to form a NAND string. One end of the NAND string may be connected to a corresponding bit line via a select transistor, controlled by a string select line SSL, and the other end of the NAND string may be connected to a common source line CSL via a select transistor, controlled by a ground select line GSL.

In another embodiment, having an odd-even architecture, bit lines may be divided into even bit lines (BLe) and odd bit lines (BLo). In the odd-even architecture, storage elements in a common word line and connected to the odd bit lines may be programmed by a first operation, while storage elements in the common word line and connected to even bit lines may be programmed by a second operation.

Figure 4:
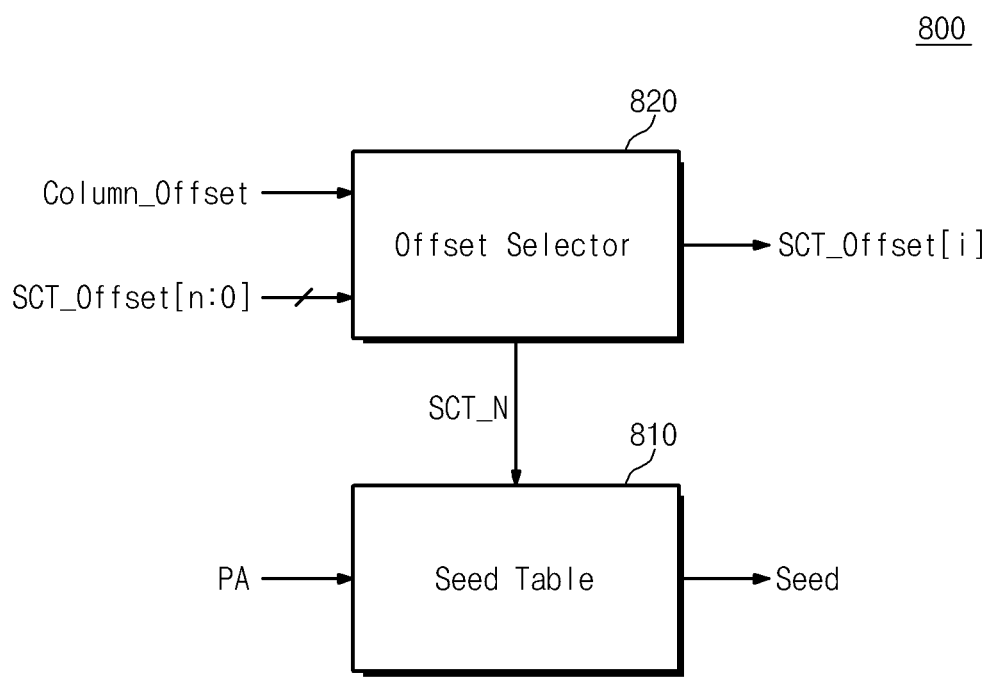
FIG. 4 is a block diagram illustrating an example of the seed selector circuit in FIG. 1, according to an exemplary embodiment of the inventive concept.

FIG. 4 is a block diagram illustrating an example of the seed selector circuit in FIG. 1, according to an exemplary embodiment of the inventive concept. FIG. 5 is a diagram illustrating an example of the seed table in FIG. 4, according to an exemplary embodiment of the inventive concept.

Referring to FIG. 4, the seed selector circuit 800 includes the seed table 810, discussed above, and an offset selector 820. The seed table 810 stores seed values assigned to each memory space, e.g., each page. The seed table 810 may further include seed values that correspond to the sector offset values SCT_Offset[1] to SCT_Offset[3], respectively, which seed values are generated based on the seed value assigned to each page. For example, referring to the representative seed table 810 illustrated in FIG. 5, a seed value is provided for each page (e.g., pages P0~P127), and multiple seed values are generated based on the page seed value for each page. For example, in FIG. 5, RM[0x87f, 1K] indicates a seed value corresponding to the first sector offset value SCT_Offset[1], generated when a seed value "0x87f" assigned to the first page P0 proceeds by a 1K clock cycle number. Thus, stated generally, RM[0x87f, mK] (m being 1, 2, 3 . . . ) indicates a seed value generated when the seed value "0x87f" assigned to the first page P0 proceeds by an mK clock cycle number.

Returning to FIG. 4, the offset selector 820 determines whether a column offset value Column_Offset coincides with one of the sector offset values SCT_Offset[n:0]. When the column offset value Column_Offset coincides with one of the sector offset values SCT_Offset[n:0], the offset selector 820 generates a sector offset value SCT_Offset[i] coinciding with the column offset value Column_Offset and a sector offset selection signal SCT_N corresponding to the sector offset value SCT_Offset[i]. When the column offset value Column_Offset does not coincide with one of sector offset values SCT_Offset[n:0], the offset selector 820 generates a sector offset value SCT_Offset[i] of the sector corresponding to the column offset value Column_Offset and a sector offset selection signal SCT_N corresponding to the sector offset value SCT_Offset[i]. The sector offset value SCT_Offset[i] is provided to the randomizing and de-randomizing circuit 600 in FIG. 1, and the sector offset selection signal SCT_N is provided to the seed table 810.

In an exemplary embodiment, the offset selector 820 generates the sector offset value SCT_Offset[i] corresponding to a sector to which the column offset value Column_Offset belongs and a sector offset selection signal SCT_N corresponding to the sector.

The seed table 810 outputs a seed value in response to the sector offset selection signal SCT_N and an address for identifying a page (or, a memory space) to be accessed. For example, when an address PA for identifying a page (or, a memory space) to be accessed has a value of P0 and the sector offset selection signal SCT_N indicates the second sector of the page, as illustrated in FIG. 5, a seed value of RM[0x87f, 1K] in the seed table 810 is selected by the address of P0 and the sector offset selection signal SCT_N corresponding to the second sector.

Figure 6:
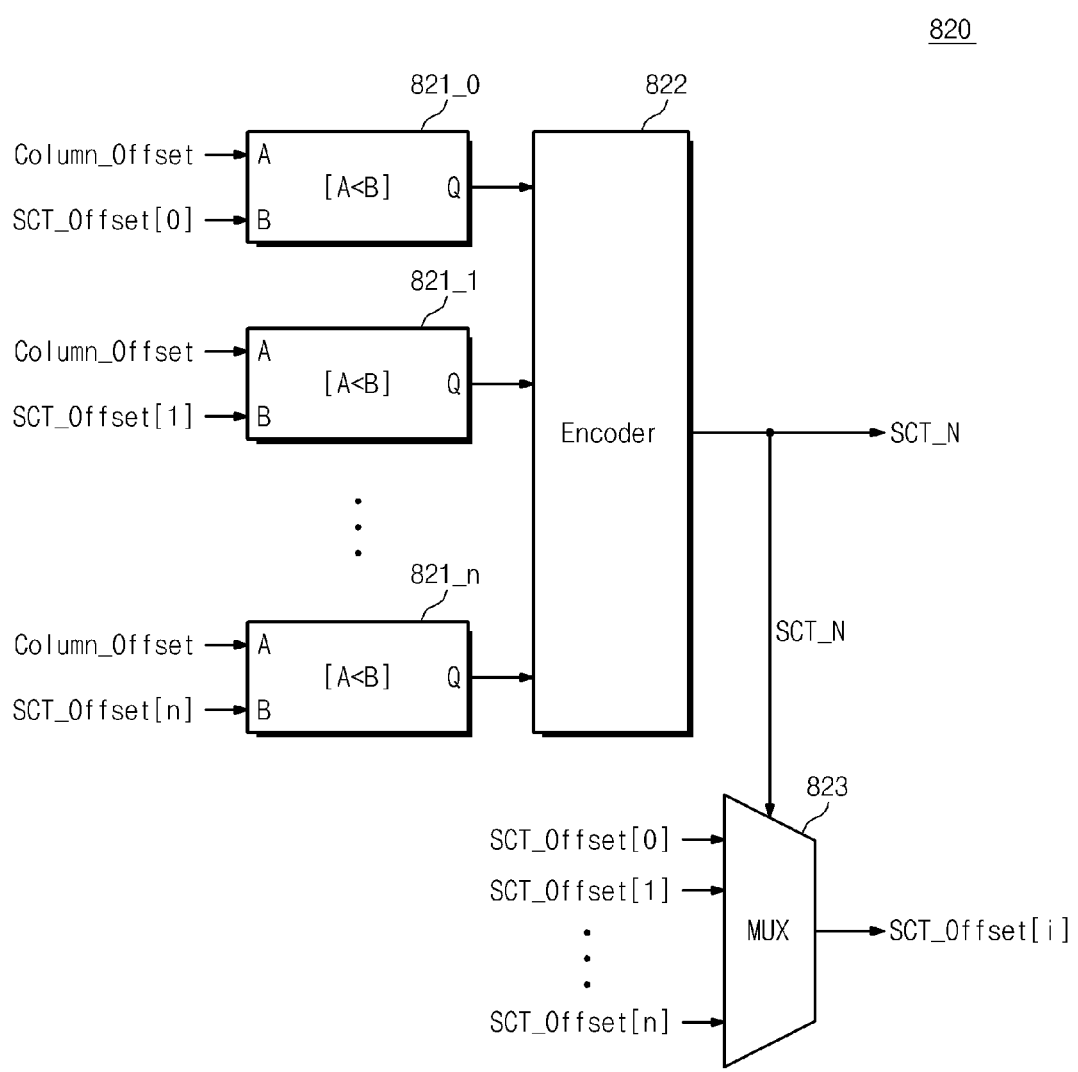
FIG. 6 is a block diagram illustrating an example of the offset selector in FIG. 4, according to an exemplary embodiment of the inventive concept.

FIG. 6 is a block diagram illustrating an example of the offset selector in FIG. 4, according to an exemplary embodiment of the inventive concept.

Referring to FIG. 6, the offset selector 820 includes multiple comparators 821_0 to 821_n, an encoder 822, and a multiplexer 823. The comparators 821_0 to 821_n correspond to sector offset values SCT_Offset[0] to SCT_Offset[n], respectively. The comparators 821_0 to 821_n receive a column offset value Column_Offset and corresponding sector offset values SCT_Offset[0] to SCT_Offset[n], respectively. Each comparator 821_0 to 821_n determines whether the column offset value Column_Offset is less than its corresponding sector offset value SCT_Offset[0] to SCT_Offset[n], and outputs a logic value of "1" or "0" according to the determination result. For example, the comparator 821_1 may output a logic value of "1" when the column offset value Column_Offset indicates an access point of a memory space that is larger than the sector offset value SCT_Offset[1], and the comparator 821_1 may output a logic value of "0" when the column offset value Column_Offset indicates the access point is smaller than the sector offset value SCT_Offset[1]. It is understood that the disclosure is not limited to logic values output by comparators, and that other comparison techniques and/or logic values may be included without departing from the scope of the present teachings. For example, various embodiments may include determining whether the column offset value Column_Offset is greater than the sector offset values SCT_Offset[0] to SCT_Offset[n].

The encoder 822 receives output values (constituting one binary code) of the comparators 821_0 to 821_n, and outputs a sector offset selection signal SCT_N corresponding to a sector identified by the column offset value Column_Offset (or, a sector to which the column offset value Column_Offset belongs). For example, when the access point to which the column offset value Column_Offset corresponds is in the first sector, the sector offset selection signal SCT_N output by the encoder 822 corresponds to the first sector. Likewise, when the access point to which the column offset value Column_Offset corresponds is in the second sector, the sector offset selection signal SCT_N output by the encoder 822 corresponds to the second sector. The multiplexer 823 selects one of the sector offset values SCT_Offset[0] to SCT_Offset[n] in response to the sector offset selection signal SCT_N. For example, when the sector offset selection signal SCT_N indicates the first sector, the multiplexer 823 selects the sector offset value SCT_Offset[0]. Of course, it is understood that the structure of the offset selector 820 is not limited to the example shown in FIG. 6.

FIG. 7 is a block diagram illustrating an example of the randomizing and de-randomizing circuit in FIG. 1, according to an exemplary embodiment of the inventive concept.

Referring to FIG. 7, randomizing and de-randomizing circuit 600 includes a clock generator 610, a selector 620, a pseudo-random sequence (PRS) generator 630, a free-run detector 640, and a mixer 650. Herein, the clock generator 610, the selector 620, the pseudo-random sequence generator 630, and the free-run detector 640 are included in a random sequence generating block 660, which sequentially generates random sequence data RSD being provided to the mixer 650. A group of sequentially generated random sequence data RSD may form a random sequence RS.

The clock generator 610 is configured to generate a clock signal CLK. The selector 620 selects one of input clock signal CLK and read/write enable signal RE/WE in response to a free-run signal FRS output from the free-run detector 640 as a selection signal. For example, when the free-run signal FRS is activated, the selector 620 may select the clock signal CLK from the clock generator 610 as its output signal, and when the free-run signal FRS is inactivated, the selector 620 may select the read/write enable signal RE/WE toggled by data input/output of a read/write operation as its output signal. The clock signal CLK or the read/write enable signal RE/WE selected by the selector 620 is provided to the PRS generator 630 as a random sequence clock signal CLK_RS. The PRS generator 630 operates in response to the random sequence clock signal CLK_RS, and sequentially generates random sequence data RSD using a seed provided by the seed selector circuit 800 in FIG. 1. The random sequence RS may be formed of a set of data bits, for example, and each data bit of the random sequence RS may be provided to the mixer 650 as the random sequence data RSD. In another example, the random sequence RS may be formed of a set of data bit groups, where each data bit group may be formed of two or more data bits.

In an exemplary embodiment, the random sequence data RSD for substantially randomizing first data provided to the mixer 650 may be referred to as initial random sequence data. A seed needed for randomization of the first data or to generate initial random sequence data may be referred to as an initial seed.

In an exemplary embodiment, the PRS generator 630 may include a linear feedback shift register (LFSR), which is formed of one shift register and one or more XOR logic gates, for example. However, it is understood that the PRS generator 630 may be implemented by a PN (pseudo-random number) generator, a CRC (cyclic redundancy code) generator, or the like.

Continuing to refer to FIG. 7, the free-run detector 640 generates the free-run signal FRS in response to a column offset value Column_Offset and a sector offset value SCT_Offset[i]. In an exemplary embodiment, the column offset value Column_Offset may have a value of a column address provided in an access request. The column offset value Column_Offset may differentiate according to whether the access request is associated with full-page data or random data. For example, when a read/write operation of full-page data is requested, the column offset value Column_Offset may have a value of "0," and when a read/write operation of random data is requested, the column offset value Column_Offset may have a value larger than "0".

In various embodiments, a data location to be read according to an access request, that is, an access point, may be determined via a column address. For example, the first access point of page data may be decided by a column address having a value of "0". Remaining access points of the page data may be decided by column addresses each having a value larger than "0". A data location to be accessed/read may include a column location of a page buffer circuit 400 or a column location of a page. Likewise, in various embodiments, a location where data is to be stored according to an access request, that is, an access point, may be determined via a column address. For example, the first access point of page data may be decided by a column address having a value of "0". Remaining access points of the page data may be decided by column addresses each having a value larger than "0". The column offset value Column_Offset may be called an offset address.

In the depicted embodiment, the free-run detector 640 includes a counter 641 and a comparator 642. The counter 641 operates in synchronization with the clock signal CLK generated by the clock generator 610, for example. The counter 641 may be initialized with a sector offset value SCT_Offset [i] as an initial value. The comparator 642 compares the count value of the counter 641 with the column offset value Column_Offset to generate the free-run signal FRS according to the comparison result. For example, the free-run signal FRS is inactivated when the initial value of the counter 641 coincides with the column offset value Column_Offset. In other words, the free-run signal FRS is inactivated when the column offset value Column_Offset indicating the random access point coincides with the sector offset value SCT_Offset[i]. In contrast, the free-run signal FRS is activated when the initial value of the counter 641 is different from the column offset value Column_Offset. In this case, the counter 641 counts until the comparator 642 determines that the count value reaches the column offset value Column_Offset and inactivates the free-run signal FRS. The time during which the counter 641 counts may be referred to as the free-run period. The counter 641 does not operate when the free-run signal FRS is inactivated.

Therefore, during a read/write operation, the counter 641 does not operate when the column offset value Column_Offset coincides with the sector offset value SCT_Offset[i]. The comparator 642 of the free-run detector 640 inactivates the free-run signal FRS. When the free-run signal FRS is inactivated, the read/write enable signal RE/WE toggled by data input/output is provided to the PRS generator 630 via the selector 620 as the random sequence clock signal CLK_RS. The read/write enable signal RE/WE may be toggled to provide random sequence data RSD to the mixer 650 according to a read/write request.

The counter 641 operates when the column offset value Column_Offset is different from the sector offset value SCT_Offset[i]. That is, when the column offset value Column_Offset is different from an initial value of the counter 641, the counter 641 performs a count operation in synchronization with the clock signal CLK. The comparator 642 of the free-run detector 640 activates the free-run signal FRS. When the free-run signal FRS is activated, the clock signal CLK generated by the clock generator 610 is provided to the PRS generator 630 via the selector 620 as the random sequence clock signal CLK_RS. While the clock signal CLK generated by the clock generator 610 is provided to the PRS generator 630 via the selector 620 as the random sequence clock signal CLK_RS, no data is transferred to the mixer 650. Although no data is provided to the mixer 650, the PRS generator 630 sequentially generates random sequence data RSD in synchronization with the clock signal CLK.

An operation for generating initial random sequence data for actual randomization of the first data may be referred to as a free-run operation. As discussed above, the free-run detector 640 inactivates the free-run signal FRS when a count value reaches the column offset value Column_Offset. When the state of the free-run signal FRS transitions from an active state to an inactive state, the read/write enable signal RE/WE is provided to the PRS generator 630 via the selector 620 as the random sequence clock signal CLK_RS at data input/output. Also, the operation of the counter 641 is stopped according to the inactive state of the free-run signal FRS.

The mixer 650 logically combines the random sequence data RSD and data (or, random sequence and data provided to the mixer 650) and outputs combined data as randomized/de-randomized data. For example, during a read operation, the mixer 650 logically combines randomized data provided via a column selector circuit 500 and the random sequence data RSD, and outputs combined data to an input/output interface 700 as de-randomized data. During a write operation, the mixer 650 logically combines data provided via the input/output interface 700 and the random sequence data RSD, and outputs combined data to the column selector circuit 500 as randomized data. In the event that byte data is provided to the mixer 650, a random sequence data bit may be logically combined with each of data bits to be read/programmed.

Herein, the free-run signal FRS may have either one of an active-high level and an active-low level according to whether a requested access is a random data access.

In an exemplary embodiment, the mixer 650 may be formed of XOR logic. However, it is understood that the structure of the mixer 650 is not limited thereto. Further, it is understood that the structure of the free-run detector 640 is not limited to this disclosure.

Figure 8A:
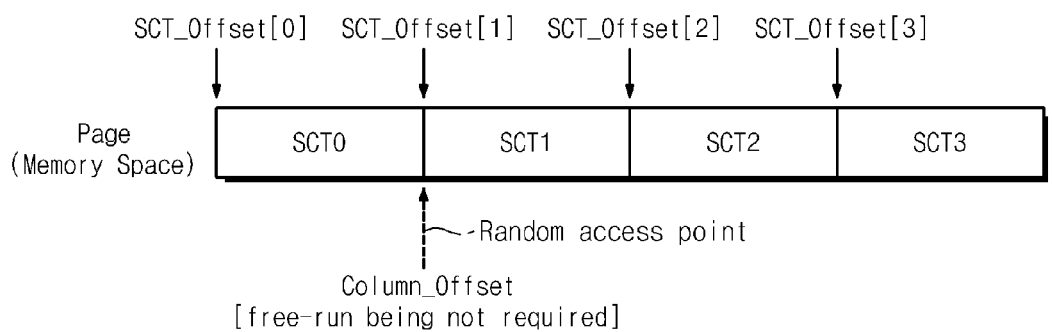
FIGS. 8A and 8B are block diagrams for describing access operations of a flash memory device, according to an exemplary embodiment of the inventive concept.
Figure 8B:
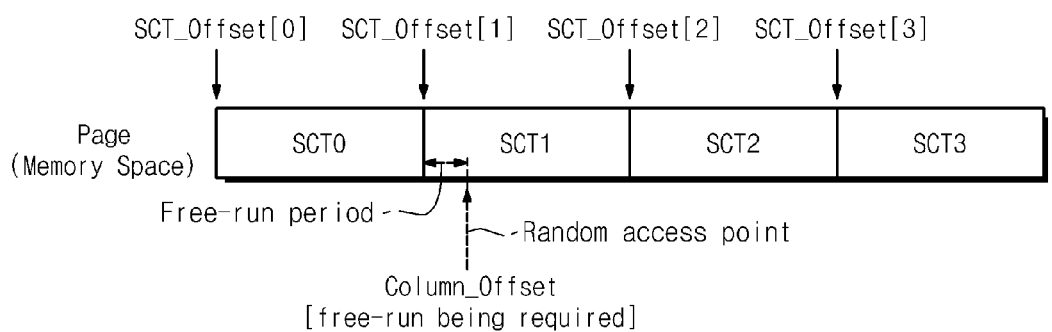

FIGS. 8A and 8B are diagram for describing an access operation of a flash memory device, according to an exemplary embodiment of the inventive concept. Below, a representative access operation of a flash memory device, according to an exemplary embodiment, will be more fully described with reference to accompanying drawings.

In response to an access request, a first address PA identifying a memory space (or, a page) and a second address (hereinafter, referred to as a column offset value) indicating an access point of the memory space are provided to a flash memory device. For example, a command corresponding to the access request may be provided to the flash memory device together with the first and second addresses. Once the first and second addresses are provided to the flash memory device, the seed selector circuit 800 provides a seed to the randomizing and de-randomizing circuit 600 in response to the first address PA and the column offset value Column_Offset as the second address.

The offset selector 820 generates a sector offset selection signal SCT_N identifying a sector or sector offset value SCT_Offset[n:0] with which the column offset value Column_Offset coincides or to which the column offset value Column_Offset belongs. For example, FIG. 8A illustrates when the column offset value Column_Offset coincides with the sector offset value SCT_Offset[1], in which case the encoder 822 of the offset selector 820 generates a sector offset selection signal SCT_N corresponding to the sector offset value SCT_Offset[1], and the multiplexer 823 of the offset selector 820 outputs the sector offset value SCT_Offset[1] corresponding to the sector offset selection signal SCT_N. The sector offset value SCT_Offset[1] and a seed value are provided to the randomizing and de-randomizing circuit 600. Since the column offset value Column_Offset coincides with the sector offset value SCT_Offset[1], the randomizing and de-randomizing circuit 600 performs a randomizing/de-randomizing operation using a seed value provided by the seed table 810 as an initial seed without a free-run operation described in FIG. 7. The free-run operation is described above with reference to FIG. 7, and the description therefore will not be repeated.

FIG. 8B illustrates when the column offset value Column_Offset does not coincide with the sector offset value SCT_Offset[1] (or any other sector offset value), but is located within the second sector SCT1. In this case, the encoder 822 of the offset selector 820 generates a sector offset selection signal SCT_N corresponding to the sector offset value SCT_Offset[1] indicating the sector to which the column offset value Column_Offset belongs (the second sector). At this time, the multiplexer 823 of the offset selector 820 outputs sector offset value SCT_Offset[1] corresponding to the sector offset selection signal SCT_N. The sector offset value SCT_Offset[1] and a seed value is provided to the randomizing and de-randomizing circuit 600. Since the column offset value Column_Offset does not coincide with the sector offset value SCT_Offset[1], as illustrated in FIG. 8B, the randomizing and de-randomizing circuit 600 performs the free-run operation during a free-run period. The free-run operation may be performed as described above with reference to FIG. 7, and thus the description will not be repeated. The PRS generator 630 is set with an initial seed via the free-run operation. Afterwards, the randomizing and de-randomizing circuit 600 performs a randomizing/de-randomizing operation using the initial seed generated via the free-run operation.

FIG. 9 is a block diagram illustrating a memory system, according to an exemplary embodiment of the inventive concept.

Referring to FIG. 9, a memory system 3000 includes at least one flash memory 1000 and a controller 2000. The flash memory 1000 operates under the control of the controller 2000, and may be used as a storage medium. The controller 2000 is configured to control the flash memory 1000. The flash memory 1000 includes a randomizer/de-randomizer circuit 1100 and a seed selector circuit 1200. The flash memory device 1000 may be configured the same as shown in FIG. 1, for example, and thus the description thereof will not be repeated. The seed selector circuit 1200 includes seed values assigned to respective pages in each memory block and seed values corresponding to respective decided access points (or, decided sector offset values) in each page. When random access is requested, one of the seed values is provided to the randomizer/de-randomizer circuit 1100. As described above, the randomizer/de-randomizer circuit 1100 selectively performs a free-run operation for generating an initial seed based on whether a column offset value coincides with a sector offset value.

In the depicted embodiment, the controller 2000 includes first interface 2100, second interface 2200, a processing unit 2300, a buffer memory 2400, and an ECC block 2500. The first interface 2100 is configured to interface with an external device (e.g., a host), and the second interface 2200 is configured to interface with the flash memory 1000. The processing unit 2300 is configured to control overall operation of the controller 2000. The buffer memory 2400 is configured to store data to be stored in the flash memory 1000 or data read out from the flash memory 1000. The ECC block 2500 generates ECC data based on data output from the buffer memory 2400. The ECC block 2500 performs error detecting and correcting operations on data read out from the flash memory 1000 based on ECC data. The ECC data may be stored in the same page as data to be stored in the flash memory 1000 or in a region different from data to be stored in the flash memory 1000.

In an exemplary embodiment, the first interface 2100 of the controller 2000 may be formed of one of computer bus standards, storage bus standards, and iFCPPeripheral bus standards, or a combination of two or more standards. Examples of the computer bus standards include S-100 bus, Mbus, Smbus, Q-Bus, ISA, Zorro II, Zorro III, CAMAC, FAST-BUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. Examples of the storage bus standards include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. Examples of the iFCPPeripheral bus standards include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, etc.

Figure 10:
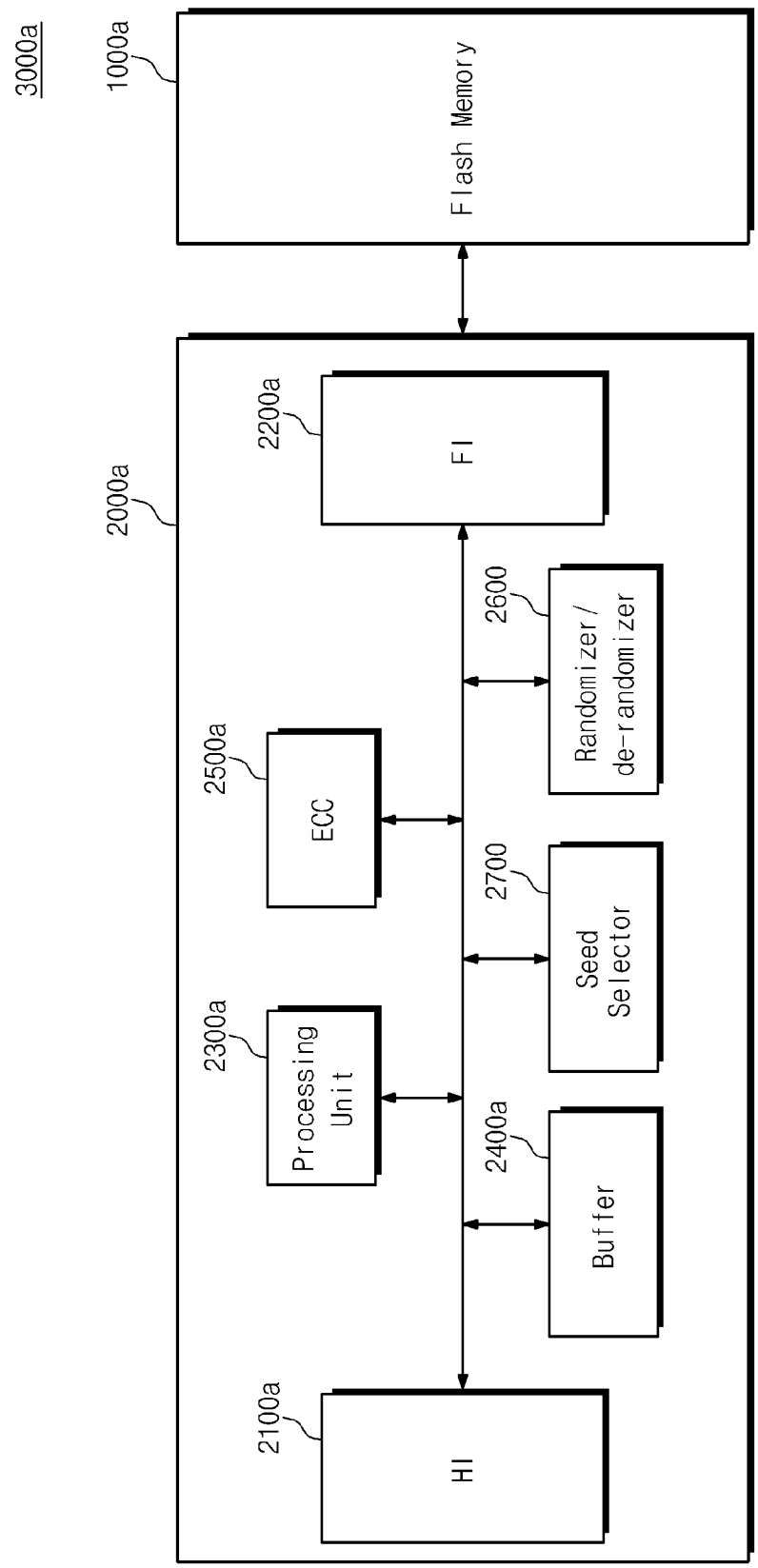
FIG. 10 is a block diagram illustrating a memory system, according to another exemplary embodiment of the inventive concept.

FIG. 10 is a block diagram illustrating a memory system, according to another exemplary embodiment of the inventive concept.

Referring to FIG. 10, a memory system 3000a includes at least one flash memory 1000a and a controller 2000a. The flash memory 1000a operates under the control of the controller 2000a, and may be used as a storage medium. The flash memory 1000a in FIG. 10 may be a typical flash memory, which does not support a randomizing and de-randomizing operation. Thus, the controller 2000a, which controls the flash memory 1000a, is configured to randomize data to be stored in the flash memory 1000a and to add ECC data to the randomized data. The controller 2000a may be configured to perform detecting and correcting operations on errors of randomized data read out from the flash memory 1000a and to de-randomize the randomized data.

In the depicted embodiment, the controller 2000a includes first interface 2100a, second interface 2200a, a processing unit 2300a, a buffer memory 2400a, an ECC block 2500a, a randomizer/de-randomizer block 2600, and a seed selector block 2700. Constituent elements 2100a, 2200a, 2300a, 2400a, and 2500a in FIG. 10 may be substantially the same as constituent elements 2100, 2200, 2300, 2400, and 2500 in FIG. 9, except for the following differences, and descriptions thereof are therefore not repeated.

The seed selector block 2700 may include seed values assigned to respective pages in each memory block and seed values corresponding to respective predetermined access points (or, predetermined sector offset values) in each page. When random access is requested, one of the seed values is provided to the randomizer/de-randomizer block 2600. As described above, the randomizer/de-randomizer block 2600 selectively carries out a free-run operation for generating an initial seed according to whether a column offset value coincides with a sector offset value. Further, the randomizer/de-randomizer block 2600 may randomize data output from the buffer memory 2400a based upon an initial seed generated via a free-run operation without a free-run operation. The randomizer/de-randomizer block 2600 may de-randomize data (i.e., randomized data) read out from the flash memory 1000a based upon an initial seed generated via a free-run operation without a free-run operation.

The ECC block 2500a generates ECC data based on randomized data output from the randomizer/de-randomizer block 2600. Further, the ECC block 2500a performs an error detecting and correcting operation on data read out from the flash memory 1000a, that is, randomized data based upon ECC data. The ECC data may be stored in the same page as data to be stored in the flash memory 1000a or in a region different from data to be stored in the flash memory 1000a.

Figure 11:
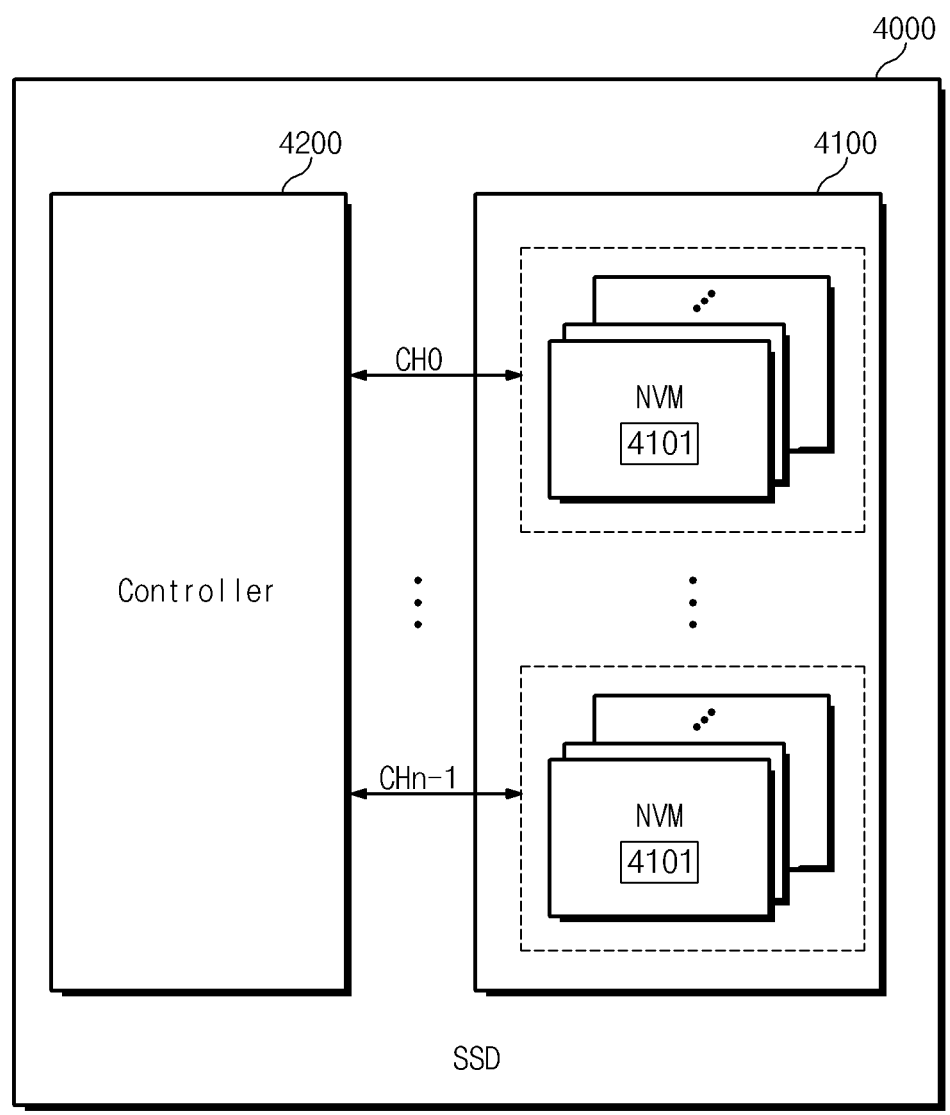
FIG. 11 is a block diagram illustrating a solid state drive, according to an exemplary embodiment of the inventive concept.

FIG. 11 is a block diagram illustrating a solid state drive, according to an exemplary embodiment of the inventive concept.

Referring to FIG. 11, a solid state driver (SSD) 4000 includes a storage medium 4100 and a controller 4200. The storage medium 4100 is connected to the controller 4200 via channels CH0 to CHn-1. Each of the channels CH0 to CHn-1 is connected in common with nonvolatile memories NVM. Each nonvolatile memory NVM may be formed of a flash memory as shown in FIG. 1, for example. That is, each nonvolatile memory NVM includes a randomizing and de-randomizing circuit 4101. In this case, the controller 4200 may be configured substantially the same as the controller 2000 in FIG. 9. That is, data randomization and de-randomization may be performed within each nonvolatile memory NVM, and error detection and correction may be performed within the controller 4200. On the other hand, each nonvolatile memory can be formed of a typical flash memory which does not support the above-described randomizing and de-randomizing function. In this case, the controller 4200 may be configured substantially the same as the controller 2000a in FIG. 10. That is, data randomization and de-randomization and error detection and correction may be performed within the controller 4200.

In an exemplary embodiment, memory cells may be variable resistance memory cells. An exemplary variable resistance memory cell and a memory device including the same are disclosed in U.S. Pat. No. 7,529,124 to Cho et al. (May 5, 2009), the entire contents of which are hereby incorporated by reference.

In another exemplary embodiment, memory cells may have one of various cell structures having a charge storage layer. Examples of cell structures having a charge storage layer include a charge trap flash structure using a charge trap layer, a stack flash structure in which arrays are stacked in a multiple layer, a source-drain free flash structure, a pin-type flash structure, and the like.

Examples of memory devices having a charge trap flash structure as a charge storage layer are disclosed in U.S. Pat. No. 6,858,906 to Lee et al. (Feb. 22, 2005) and U.S. Publication No. 2004/0169238 to Lee et al. (Sep. 2, 2004) and 2006/0180851 to Lee et al. (Aug. 17, 2006), the entire contents of each of which are hereby incorporated by reference. An example of a source-drain free flash structure is KR Patent No. 673020, the entire contents of which are hereby incorporated by reference.

A flash memory device and/or a memory controller according to the inventive concept may be packed using various types of packages. For example, a flash memory device or a memory controller according to the inventive concept may be packed using packages such as PoP (Package on Package), ball grid arrays (BGAs), chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A flash memory device comprising:
a memory cell array comprising memory cells forming a plurality of pages;
a seed selector circuit configured to store a plurality of seeds corresponding to the plurality of pages, respectively; and
a randomizing and de-randomizing circuit configured to randomize data to be stored in a selected page,
wherein each page has a corresponding seed and comprises a plurality of sectors having corresponding sector offset values and corresponding seed values generated from the seed corresponding to the page;
wherein the seed selector circuit selects a seed value from the seed values of the selected page based on a sector offset value indicating a sector of the selected page to which a column offset value, input with an access request, belongs; and
wherein the randomizing and de-randomizing circuit randomizes data to be stored in the selected page based on the seed value selected by the seed selector circuit.

2. The flash memory device of claim 1, further comprising:
a page buffer circuit between the memory cell array and the randomizing and de-randomizing circuit, the page buffer circuit being configured to store the randomized data in the memory cell array and to read data from the memory cell array.

3. The flash memory device of claim 2, wherein the seed selector circuit comprises:
a seed table configured to store the seed values respectively corresponding to the plurality of sectors of each page; and
an offset selector configured to determine whether the column offset value belongs to any one of sectors of the selected page and to output a sector offset value of a sector corresponding to the column offset value, the seed table outputting a seed value of a sector corresponding to the sector offset value output by the offset selector.

4. The flash memory device of claim 3, wherein the randomizing and de-randomizing circuit comprises:
a free-run detector configured to generate a free-run signal in response to the column offset value and the sector offset value output by the offset selector;
a selector configured to select one of a clock signal and a read/write enable signal in response to the free-run signal, and to output a random sequence clock signal in response to the selected one of the clock signal and the read/write enable signal;
a pseudo-random sequence generator initialized with a seed value provided by the seed selector circuit and configured to generate a random sequence in response to the random sequence clock signal; and
a mixer configured to randomize data to be stored in the memory cell array based on the random sequence.

5. The flash memory device of claim 4, wherein the free-run detector comprises:
a counter initialized with a sector offset value provided by the seed selector circuit and configured to operate in synchronization with the clock signal; and
a comparator configured to compare the column offset value and a count value of the counter and to generate the free-run signal in response to the comparison.

6. The flash memory device of claim 5, wherein the free-run signal is activated when the column offset value is different from a count value of the counter, and the selector selects the clock signal as the random sequence clock signal in response to the activation of the free-run signal.

7. The flash memory device of claim 6, wherein the pseudo-random sequence generator generates random sequence data in response to the clock signal as the random sequence clock signal, and the random sequence data generated according to the clock signal is not used for data randomization.

8. The flash memory device of claim 5, wherein the free-run signal is inactivated when the column offset value coincides with a count value of the counter, and the selector selects the read/write enable signal toggled by the access request as the random sequence clock signal in response to the inactivation of the free-run signal.

9. The flash memory device of claim 8, wherein the pseudo-random sequence generator generates random sequence data in response to the read/write enable signal as the random sequence clock signal, and the mixer logically combines the random sequence data and data input in synchronization with the read/write enable signal.

10. The flash memory device of claim 3, wherein the offset selector comprises:
comparators configured to receive the sector offset values, respectively, and the column offset value input with the access request;
an encoder configured to encode outputs of the comparators; and
a multiplexer configured to select one of the sector offset values in response to an encoding result of the encoder.

11. A flash memory device comprising:
a memory cell array comprising memory cells forming a plurality of pages, each page comprising a plurality of sectors having corresponding sector offset values, respectively;
an offset selector configured to determine whether a column offset value input with an access request belongs to a sector of the plurality of sectors of a selected page, and to output a sector offset value of the sector corresponding to the column offset value as a result;
a seed table configured to store seeds corresponding to the plurality of pages, respectively, and to output a seed value of the sector corresponding to the sector offset value output by the offset selector, a seed corresponding to each page providing seed values corresponding to the plurality of sectors of the corresponding page, respectively;
a free-run detector configured to generate a free-run signal in response to the column offset value and a sector offset value output from the offset selector;
a selector configured to select one of a clock signal and a read/write enable signal in response to the free-run signal;
a pseudo-random sequence generator initialized with a seed value provided by the seed table and configured to generate a random sequence in response to the one of the clock signal and the read/write enable signal selected by the selector as a random sequence clock signal; and
a mixer configured to randomize data to be stored in the memory cell array and the random sequence.

12. The flash memory device of claim 11, further comprising:
a page buffer circuit configured to temporarily store data provided by the mixer or data to be provided to the mixer.

13. The flash memory device of claim 11, wherein the free-run detector comprises:
a counter initialized with a sector offset value provided by the seed selector and configured to operate in synchronization with a clock signal; and
a comparator configured to generate the free-run signal in response to the column offset value input with the access request and a count value of the counter.

14. The flash memory device of claim 13, wherein the free-run signal is activated when the column offset value is different from the count value of the counter, the selector selects the clock signal as the random sequence clock signal in response to the activation of the free-run signal, the pseudo-random sequence generator generates random sequence data in response to the clock signal as the random sequence clock signal, and random sequence data generated according to the clock signal is not used for data randomization.

15. The flash memory device of claim 13, wherein the free-run signal is inactivated when the column offset value coincides with the count value of the counter, the selector selects the read/write enable signal toggled by the access request as the random sequence clock signal in response to the inactivation of the free-run signal, the pseudo-random sequence generator generates random sequence data in response to the read/write enable signal as the random sequence clock signal, and the mixer logically combines random sequence data and data input in synchronization with the read/write enable signal.

16. The flash memory device of claim 11, wherein the offset selector comprises:
a plurality of comparators configured to receive the sector offset values, respectively, and the column offset value input with the access request;
an encoder configured to encode outputs of the comparators; and
a multiplexer configured to select one of the sector offset values in response to an encoding result of the encoder.

17. A method of reading and writing randomized data in a memory cell array comprising a plurality of pages, each page comprising a plurality of sectors having corresponding sector offset values, the method comprising:
receiving an access request to access a selected page;
identifying a seed value corresponding to the selected page in response to the access request;
identifying a sector of the selected page to which a column offset value of the access request belongs, and a sector offset value of the identified sector;
determining whether the column offset value coincides with the sector offset value;
when the column offset value does not coincide with the sector offset value, activating a free-run signal for a free-run period and selecting a clock signal as a random sequence clock signal for generating random sequence data during the free-run period; and
when the column offset value coincides with the sector offset value or when the free-run period ends, inactivating the free-run signal and selecting a read/write enable signal toggled by the access request as the random sequence clock signal for generating the random sequence data using the seed value, the random sequence data being logically combined with data input in synchronization with the read/write enable signal for one of randomizing or de-randomizing the data.

18. The method of claim 17, wherein the free-run period ends when a counter value becomes the same as the column offset value.

19. The method of claim 17, wherein the access request comprises a first address identifying the selected page and a second address identifying an access point of the selected page.

20. The method of claim 17, wherein the seed value is identifying using a seed table configured to store seed values corresponding to the plurality of pages, respectively.

* * * * *